United States Patent
Hsu et al.

(10) Patent No.: US 7,470,929 B2
(45) Date of Patent: Dec. 30, 2008

(54) FUSE/ANTI-FUSE STRUCTURE AND METHODS OF MAKING AND PROGRAMMING SAME

(75) Inventors: Louis C. Hsu, Fishkill, NY (US); Rajiv V. Joshi, Yorktown Heights, NY (US); Jack Allan Mandelman, Flat Rock, NC (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 11/491,721

(22) Filed: Jul. 24, 2006

(65) Prior Publication Data

US 2008/0017858 A1 Jan. 24, 2008

(51) Int. Cl.
*H01L 29/10* (2006.01)
(52) U.S. Cl. ............ 257/50; 257/49; 257/E29.043; 438/96; 438/97; 438/478; 438/492
(58) Field of Classification Search .......... 257/49, 257/50; 438/96, 97, 478, 492
See application file for complete search history.

(56) References Cited

U.S. PATENT DOCUMENTS

| | | | |
|---|---|---|---|
| 5,789,795 A | 8/1998 | Sanchez et al. | 257/530 |
| 5,903,041 A * | 5/1999 | La Fleur et al. | 257/530 |
| 6,124,194 A | 9/2000 | Shao et al. | 438/600 |
| 6,242,789 B1 * | 6/2001 | Weber et al. | 257/529 |
| 6,251,710 B1 | 6/2001 | Radens et al. | 438/131 |
| 6,274,440 B1 | 8/2001 | Arndt et al. | 438/281 |
| 6,335,228 B1 | 1/2002 | Fuller et al. | 438/131 |
| 2006/0231921 A1 * | 10/2006 | Van Kampen et al. | 257/529 |

OTHER PUBLICATIONS

Shen et al , "Reactive Wetting of SiO2 substrates by molten Al," Metallurgical and Materials Transactions A—Physical Metallurgy and Materials Science 35A (2): 583-588 Feb. 2004.
Brennan et al., "Effect of Nature of Surfaces on Wetting of Sapphire by Liquid Aluminum," J. Am. Ceram. Soc., 51[10] 569-573 (1968).
J.G Li, "Wetting of Ceramic Materials by Liquid Silicon, Aluminum and Metallic Melts Containing Titanium and Other Reactive Elements: A Review," Ceramics International, 20, 391-412 (1994).

* cited by examiner

*Primary Examiner*—Sue A. Purvis
*Assistant Examiner*—Jami M Valentine
(74) *Attorney, Agent, or Firm*—Ryan, Mason & Lewis, LLP

(57) ABSTRACT

Techniques are provided for fuse/anti-fuse structures, including an inner conductor structure, an insulating layer spaced outwardly of the inner conductor structure, an outer conductor structure disposed outwardly of the insulating layer, and a cavity-defining structure that defines a cavity, with at least a portion of the cavity-defining structure being formed from at least one of the inner conductor structure, the insulating layer, and the outer conductor structure. Methods of making and programming the fuse/anti-fuse structures are also provided.

1 Claim, 5 Drawing Sheets

BEFORE

AFTER

FUSE/ANTI-FUSE STRUCTURE AND METHODS OF MAKING AND PROGRAMMING SAME

FIELD OF THE INVENTION

The present invention generally relates to semiconductor circuitry and, more particularly, to fuses and anti-fuses.

BACKGROUND OF THE INVENTION

Anti-fuses and fuses have been commonly used in the semiconductor industry for one-time programming purposes. They can be used to repair dynamic random access memory (DRAM) arrays by swapping defective cells with redundant cells. They can also be used in various products for configuration, updating and repairing. Anti-fuse structures typically include a material which initially has a very high resistance but after programming by an electrical or optical means is converted to a lower resistance state. Programming refers to the process of selectively blowing fuses and/or causing selected anti-fuses to become conductive.

FIG. 1 schematically illustrates a cross section of a prior art anti-fuse structure 10, which includes a metal-1 layer 14, an anti-fuse layer 16, and an interconnect layer 22 embedded in a dielectric layer 18. Interconnect layer 22 is formed in via 20 through layer 18. During programming, an appropriate voltage between metal-1 layer 14 and interconnect layer 22 is applied to create a conductive path, i.e., resistance of the anti-fuse structure is lowered after the programming.

Processing for integrating the anti-fuse structures mentioned above requires at least one extra masking and etching step, which increases overall fabrication costs. Further, since the programming voltage for creating the electrical path is a function of the thickness of the anti-fuse layer 16, the anti-fuse material can be damaged by dielectric over-etch or under-etch, which could lead to programming failure, i.e., the electrical path would not be properly formed when an appropriate voltage is applied. Most of the existing anti-fuse structure have a layer of anti-fuse material sandwiched in between two "disconnected" conductive materials. This requirement not only limits the design flexibility and enlarges the area required for forming the element, but also requires high programming voltage to break the anti-fuse layer during programming.

U.S. Pat. No. 5,789,795 entitled "Methods and apparatus for fabricating anti-fuse devices," granted Aug. 4, 1998 to Sanchez et al., teaches an etch stop layer disposed above an anti-fuse layer, and an inter-metal oxide layer disposed above the etch layer, with the oxide layer having a via formed therein. U.S. Pat. No. 6,335,228 entitled "Method for making an anti-fuse," granted Jan. 1, 2002 to Fuller et al., teaches a process for producing DRAMs having redundant components, including steps for concurrently forming normal contacts and anti-fused contacts. U.S. Pat. No. 6,251,710 entitled "Method of making a dual damascene anti-fuse with via before wire," granted Jun. 26, 2001 to Radens et al., teaches an anti-fuse structure which includes: a substrate having a first level of electrically conductive features; a patterned anti-fuse material; a patterned interlevel dielectric material; and a second level of electrically conductive features.

U.S. Pat. No. 6,124,194 entitled "Methods of fabrication of anti-fuse integrated with dual damascene process," granted Sep. 26, 2000 to Shao et al., teaches an anti-fuse process which uses a SiN layer to pattern at least two openings. The first opening exposes the metal via, and the second opening exposes a portion of the first dielectric layer above the second metal line. U.S. Pat. No. 5,903,041, entitled "Integrated Two-Terminal Fuse-Antifuse and Fuse and Integrated Two-Terminal Fuse-Antifuse Structures Incorporating an Air Gap," was granted May 11, 1999 to LaFleur et al. In the La Fleur design, air gaps are presented above and below the fuse element. The fuse and antifuse are operated in a mutually exclusive manner. First, high voltage is built up across the antifuse to cause it to short. Then, the fuse is blown open via a high level of current flow. Fuse material is not used to short the antifuse. High programming voltage levels are required to program the antifuse.

Further improvements in prior art approaches are desirable.

SUMMARY OF THE INVENTION

Principles of the present invention provide techniques for fuse/anti-fuse structures. In one aspect, an exemplary embodiment of such a structure includes an inner conductor structure, an insulating layer spaced outwardly of the inner conductor structure, an outer conductor structure disposed outwardly of the insulating layer, and a cavity-defining structure that defines at least one cavity, at least a portion of the cavity-defining structure being formed from at least one of the inner conductor structure, the insulating layer, and the outer conductor structure. In a first state, the inner conductor structure is electrically open and defines a gap, while the outer conductor structure is electrically conductive. In a second state, the inner conductor structure becomes electrically conductive, while the outer conductor structure becomes electrically open. The at least one cavity is located substantially adjacent the gap defined in the inner conductor structure.

In another aspect, an exemplary method of programming a fuse/anti-fuse structure includes the steps of providing a fuse/anti-fuse structure of the kind just described and causing the fuse/anti-fuse structure to transition between a first state where the inner conductor structure is open and the outer conductor structure is conductive and a second state wherein the inner conductor structure is conductive and the outer conductor structure is open, by transiently forming molten material from the outer conductor structure and causing the material to flow and close the inner conductor structure.

In yet another aspect, an exemplary method of forming a fuse/anti-fuse structure includes the steps of forming an inner conductor structure having a non-conductive gap and having first and second sides, depositing a layer of dielectric outward of the inner conductor structure to form an insulating layer spaced outwardly of the inner conductor structure, forming voids on the first and second sides of the inner conductor structure, and forming an outer conductor structure running over the voids and the dielectric layer. The voids can be located substantially adjacent the non-conductive gap in the inner conductor structure.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
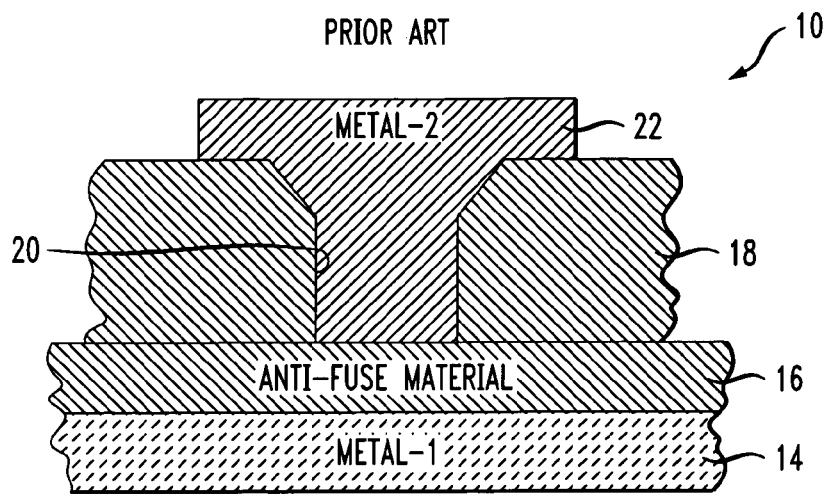
FIG. 1 shows a prior-art fuse/anti-fuse structure.
Figure 2:
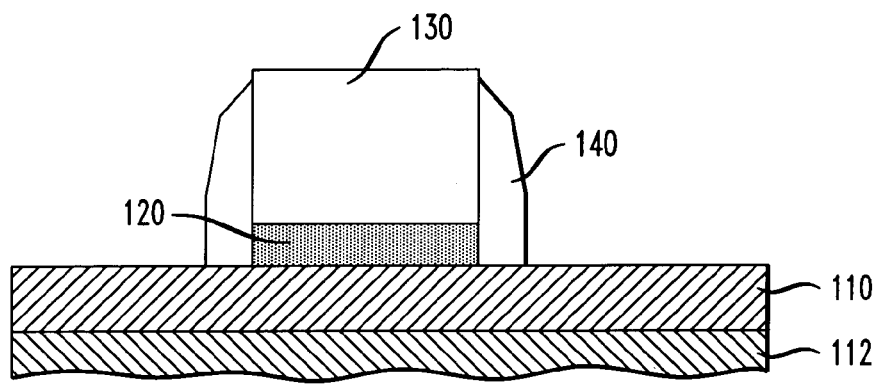
FIGS. 2-9 illustrate respective progressive cross-sectional side views during an exemplary method of forming a fuse/anti-fuse cell in accordance with an exemplary embodiment of the invention.

FIG. 2 depicts deposition of a conductive material 110 having a melting temperature approximately in the range of 800° C. to 1300° C. The material can be deposited on a substrate such as a wafer 112. Such material can include, for example, doped poly-silicon, tungsten, silicides, and the like. A dielectric film 120, such as oxide, and a doped glass 130, such as Phosphorous doped silicate glass, Boron doped silicate glass, or Boron and Phosphorous doped silicate glass (respectively, PSG, BSG or BPSG) are then deposited. Layers 130 and 120 are patterned via conventional lithographic and etching processes to form an inner conductor structure mask. Etching selectively stops at the surface of layer 110. When the mask is formed, nitride spacers 140 are then formed on the sidewalls of the hard mask stack 130 and 120.

Figure 3:
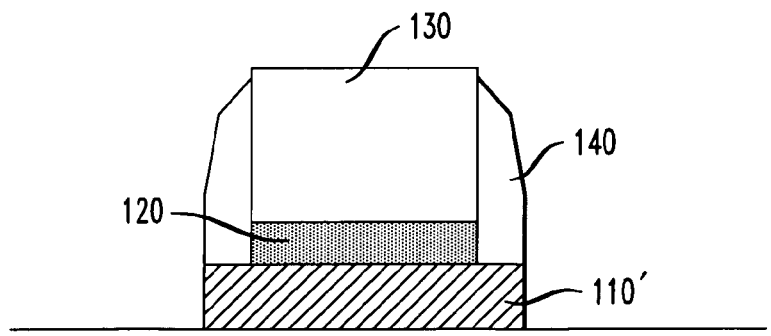
Figure 4:
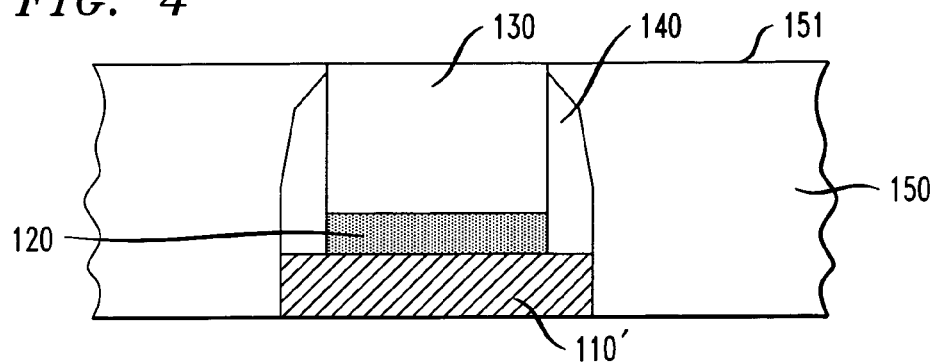
Figure 5:
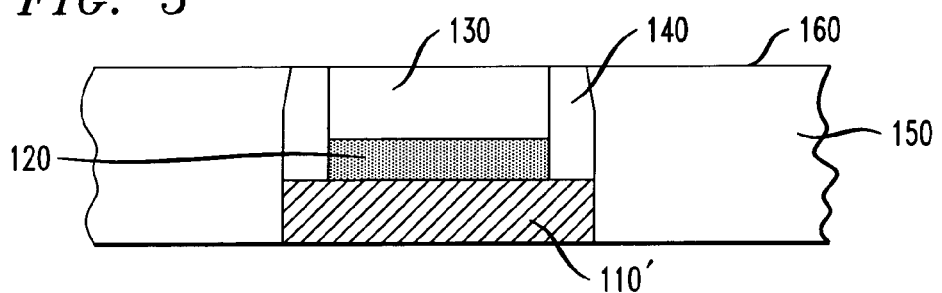

As shown in FIG. 3, a metal etching step is carried out using the mask to etch underlying metal material 110 of FIG. 2 to form an inner conductor structure 110'. As shown in FIG. 4, the etched structure is filled with chemical vapor deposition (CVD) oxide 150 and is planarized by a chemical-mechanical polishing (CMP) step (resulting in outer surface 151). Then, as shown in FIG. 5, it is over-polished by about 20% to a level 160, until substantial width of the spacers 140 is exposed. Note that in the exemplary embodiment depicted, the spacers 140 function as side-wall spacers.

Figure 6:
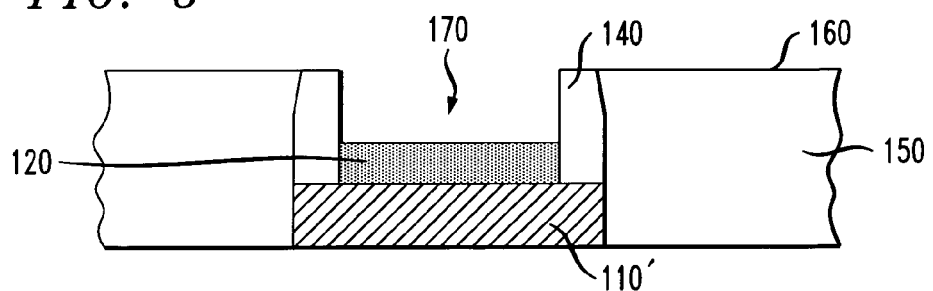
Figure 7:
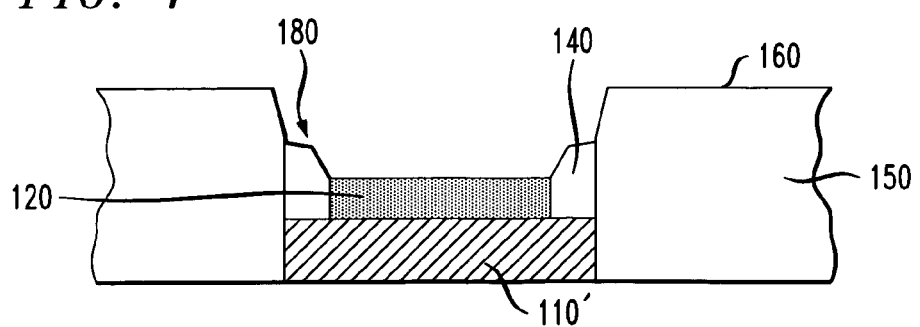

The exposed doped glass material 130 is selectively removed by wet etching to form cavity 170, as shown in FIG. 6. As shown at 180 in FIG. 7, the nitride spacers 140 are recessed by a directional dry etch to approximately the top of dielectric layer 120, and the corners of the trench are also rounded off.

Figure 8:
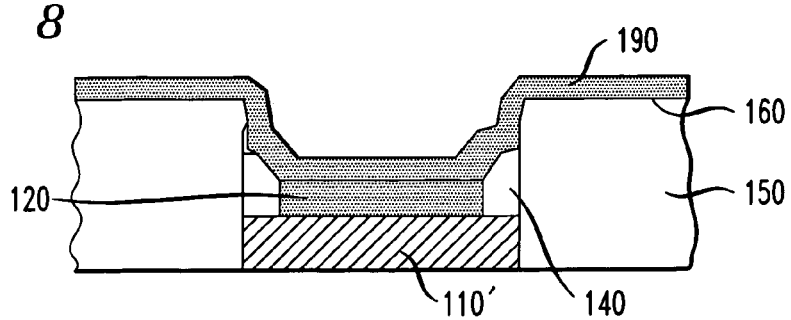

Referring now to FIG. 8, a second conductive material will be used to form an outer conductor structure 190. Such material has a lower melting point (approximately 500° C. to 800° C.) than the first conductor 110'. The conductive material could be, for example, aluminum or its alloys. The second conductive material is deposited and can be patterned using conventional lithography and etching processes to form the aforementioned outer conductor structure 190.

Figure 9:
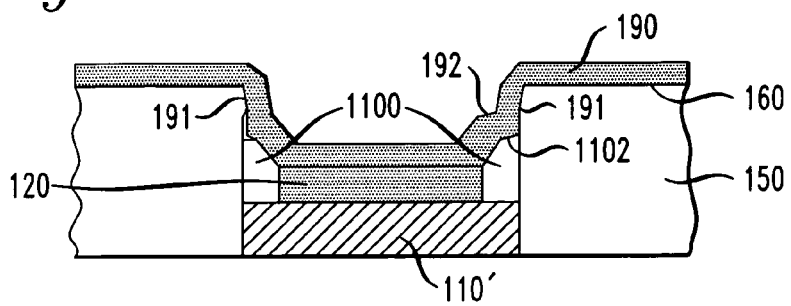

Once the outer conductor structure 190 is defined, portions of the nitride spacers 140 are exposed. As seen in FIG. 9, at this time, the spacers can be completely stripped with dry or wet etch to form voids 1100 (or cavities) over the edges of the inner conductor, and inward of the outer conductor. The outer conductor is now attached to the sidewalls of the trench as well as to the outer surface of the dielectric film 120 overlying the inner conductor. The size of the cavity can be controlled by the amount of recess of the spacer material during recess etching. Despite the cavities, the outer conductor 190 has good mechanical support from film 120 and oxide 150, with only a relatively small unsupported span over cavities 1100. The cavities are used to allow reflow of the outer conductor during programming via electrical or optical means. The cavities direct the outer conductor material to flow inwardly and make connection to the inner conductors. To assist such flow, if desired, the inner conductor structure can be located below the outer conductor structure. That is to say, it is desirable that during programming, the inner structures be located beneath the outer structures to aid flow of molten material via gravity; however, other techniques not using such an orientation (e.g., flow via surface tension) are also intended to be included within the inventive scope.

It will thus be appreciated that in one aspect, an exemplary fuse/anti-fuse structure includes an inner conductor structure (or simply an inner conductor) 110', an insulating layer 120 spaced outwardly of the inner conductor structure, an outer conductor structure (or simply an outer conductor) 190 disposed outwardly of the insulating layer, and a cavity-defining structure that defines a cavity 1100. At least a portion of the cavity-defining structure if formed from at least one of the inner conductor structure 110', the insulating layer 120, and the outer conductor structure 190; in the exemplary embodiment depicted, CVD oxide 150 also helps to define the cavity 1100.

The exemplary fuse/anti-fuse structure is adapted to transition between a first state where the inner conductor structure is open and the outer conductor structure is conductive and a second state wherein the inner conductor structure is conductive and the outer conductor structure is open. As will be seen in additional detail below, in the first state, the outer conductor structure comprises a continuous wire having low resistance and the inner conductor structure comprises first and second wire portions with a gap therebetween. The outer conductor structure 190 is adapted to be blown open and to become highly electrically resistive in the second state, transiently forming molten material when transitioning between the first and second states, while the two pieces of the inner conductor 110' are adapted to be joined together in the second state by the molten material. The cavity-defining structure defines edges 1102 of the cavity 1100 and the outer conductor structure 190 is formed so as to have a corner region 192 adjacent the edges 1102 of the cavity region. The cavity 1100 is located inward of the outer conductor structure 190. Structure 190 can be formed with inward-projecting sidewalls 191 having the aforementioned inner corner regions 192 adjacent the edges 1102 of the voids or cavity region 1100. As used herein, "open" or relatively high resistance means having a resistance greater than about 5 k-ohms, while closed or relatively low resistance means having a resistance less than about 100 ohms. Anything in between this range may constitute an undetermined state corresponding to unsuccessful programming It will be further appreciated that an exemplary method of forming a fuse/anti-fuse structure can include the steps of forming an inner conductor structure 110' having a non-conductive gap (discussed below) and having first and second sides, depositing a layer of dielectric outward of the inner conductor structure to form an insulating layer 120 spaced outwardly of the inner conductor structure, forming voids 1100 on the first and second sides of the inner conductor structure, and forming an outer conductor structure 190 running over the voids and the dielectric layer.

Figure 10:
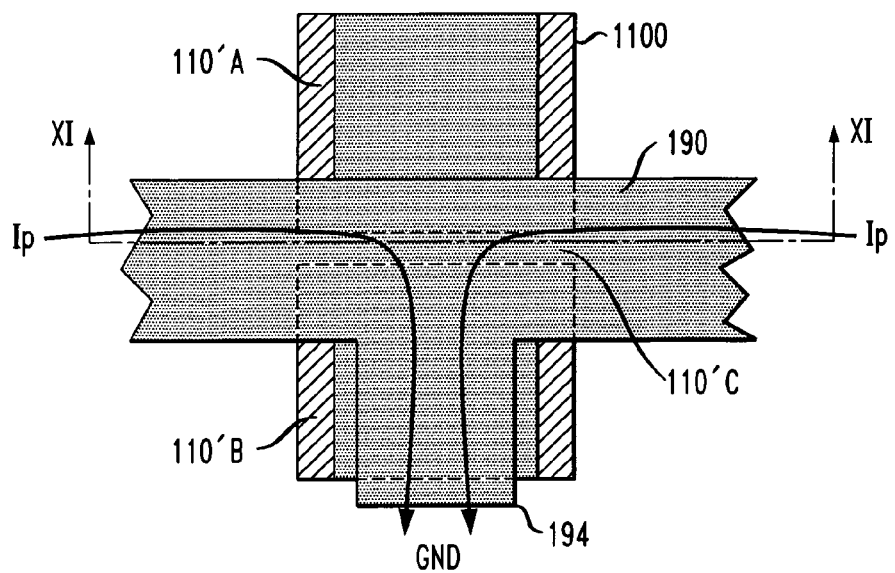
FIG. 10 illustrates a top view of one finished exemplary embodiment of the invention.
Figure 11:
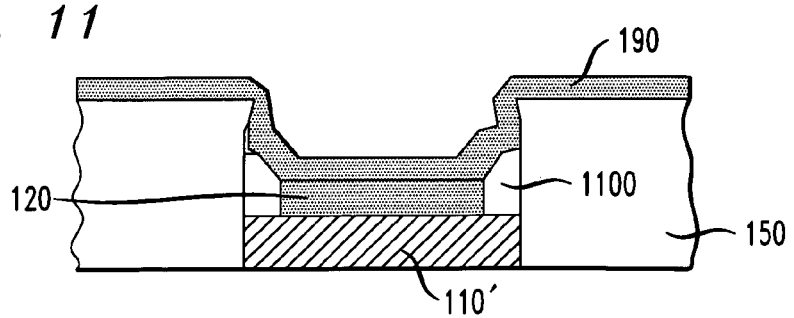
FIG. 11 illustrates a cross-sectional view, taken along line XI-XI of FIG. 10, of the embodiment of FIG. 10.

Referring now to FIGS. 10 and 11, in the exemplary embodiment depicted therein, the anti-fuse is programmed using a relatively high (for example, on the order of about 10 mA to about 30 mA) programming current, Ip, fed from both sides of the main portion of outer conductor structure 190 and drained to the center portion 194 (also referred to herein as a T projection) which is grounded and labeled as "Gnd." In FIG. 10, two pieces 110'A and 110'B of the inner conductor structure are shown by dotted boxes (note that the lower electrode is split and separated by a gap 110'C). The high current density causes the outer conductor structure to melt (thus forming molten material), due to its lower melting temperature, and flow downward through the cavities 1100 to cause the two pieces of the lower electrode to join and thus accomplish the anti-fuse operation. The cavity or voids 1100 are typically formed substantially adjacent the gap 110'C in the inner conductor structure 110'. As previously noted, FIG. 11 illustrates a cross-sectional view, taken along line XI-XI of FIG. 10, of the embodiment of FIG. 10.

Figure 12:
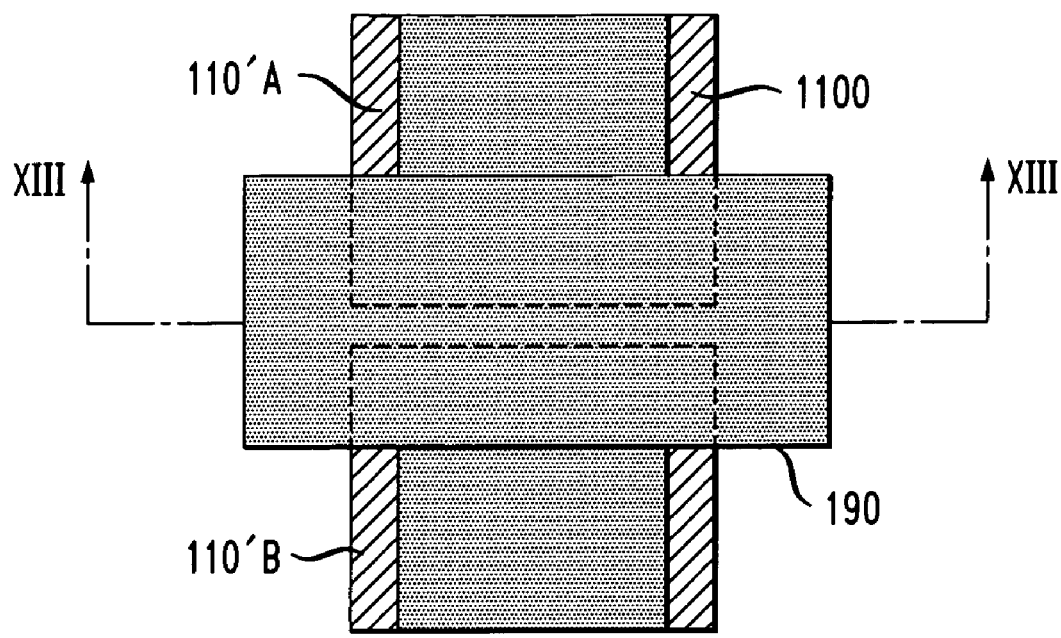
FIG. 12 illustrates a top view of another finished exemplary embodiment of the invention.
Figure 13:
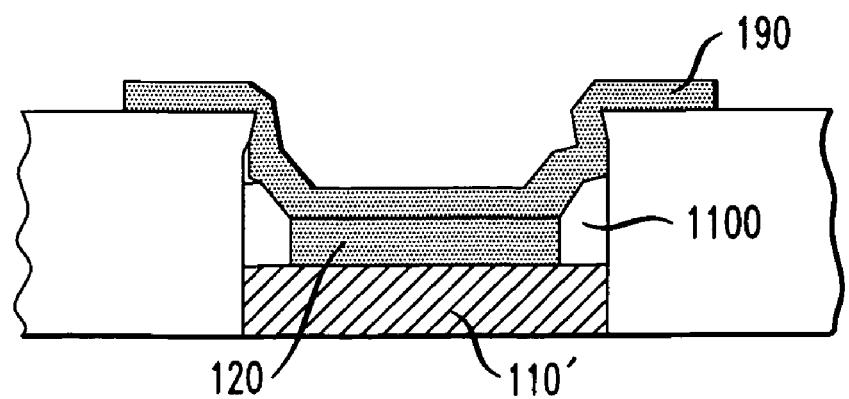
FIG. 13 illustrates a cross-sectional view, taken along line XIII-XIII of FIG. 12, of the embodiment of FIG. 12.

In another exemplary alternative depicted in FIGS. 12 and 13, a laser or other optical energy source can be employed to locally heat the outer conductor 190 above its melting point. Due to the existing trench structure, the melted conductive material will flow inwards (downwards, if desired, to aid the flow via gravity) and join the two inner conductors 110'A and 110'B. At this point, the outer conductor is used as a source that supplies the conductive material during programming. As previously noted, FIG. 13 illustrates a cross-sectional view, taken along line XIII-XIII of FIG. 12, of the embodiment of FIG. 12. Note also that in the various drawings, similar items are identified with similar reference characters.

Figure 14:
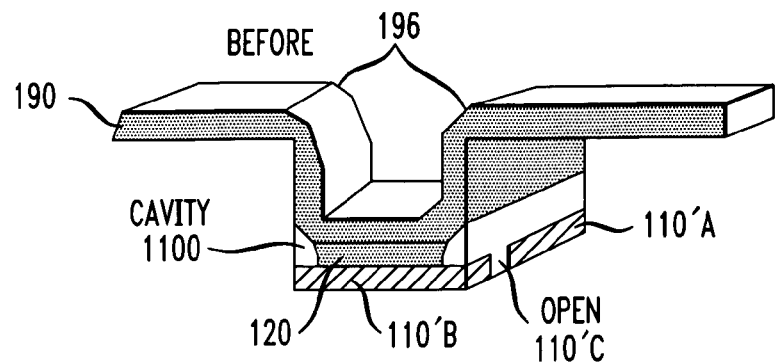
FIGS. 14 and 15 illustrate respectively perspective views of a third exemplary embodiment of the invention before and after programming the fuse/anti-fuse structure, according to yet another aspect of the invention.
Figure 15:
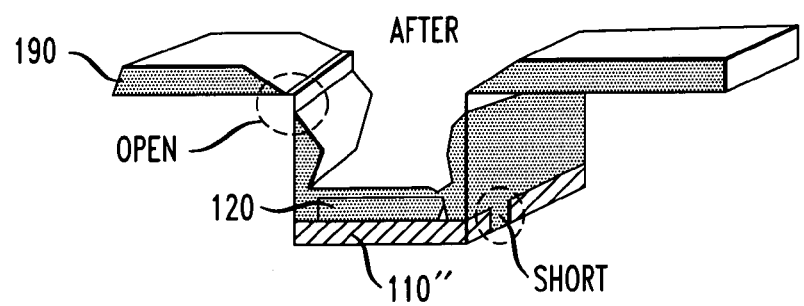
Figure 16:
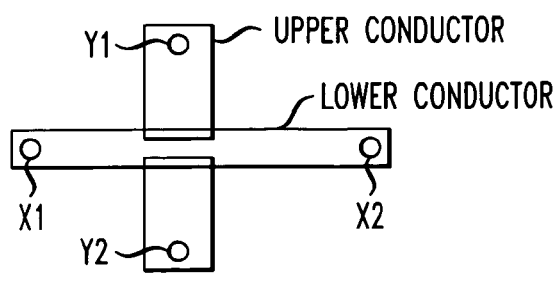
FIGS. 16 and 17 illustrate respectively the circuit diagram of the third exemplary embodiment before and after programming the fuse/anti-fuse structure thereof.
Figure 17:
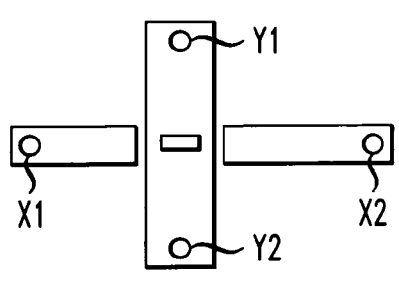

In yet another alternative embodiment shown in FIGS. 14-17, the outer conductor can be used for connecting two nodes X1 and X2. Recall that FIGS. 14 and 15 illustrate respectively perspective views before and after programming and FIGS. 16 and 17 illustrate the circuit diagram before and after programming. The skilled artisan will appreciate that a "node" may be defined as a point where two or more circuit elements have a common connection. After being electrically programmed, the outer conductor is opened as shown in FIGS. 15 and 17 via "fuse-type" programming. Simultaneously, the inner conductor which is originally open as shown at 110'C becomes shorted due to metal reflow during programming forming inner conductor 110". Such anti-fuse programming connects two nodes Y1 and Y2 as shown in FIG. 17.

Since the programming current flows in two directions, with reference back to FIG. 10, complete opening is assured to occur at both corners of the outer conductor 190. The small cross-sectional area and corners of the outer conductor result in current crowding and enhanced heating and melting relative to the other portions of the outer conductor. After programming the outer conductor is "fully" open, that is, there is no electrical continuity between the inner conductor and either outer horizontal surface of the outer conductor.

Thus, as shown in FIGS. 14-17, the outer conductive structure is formed with at least one reduced cross-sectional area region, such as regions 196, and is adapted to accomplish the transition between the first and second states by causing an electric current to flow through the reduced cross-sectional area region, thereby heating the reduced cross-sectional area region, via current crowding, to form the molten material.

It will thus be appreciated that an exemplary method of programming a fuse/anti-fuse structure can include the steps of providing a fuse/anti-fuse structure of the kind described, and causing the fuse/anti-fuse structure to transition between a first state where the inner conductor structure is open and the outer conductor structure is conductive and a second state wherein the inner conductor structure is conductive and the outer conductor structure is open, by transiently forming molten material from the outer conductor structure and causing the material to flow and close the inner conductor structure. In the first state, the outer conductor structure comprises a continuous wire having relatively low resistance and the inner conductor structure comprises first and second wire portions with a gap therebetween.

As shown in FIGS. 10 and 11, in one aspect, the outer conductive structure is formed with a main portion and a T projection, and the step of causing the transition comprises causing an electric current to flow from the main portion to the T projection, thereby heating the outer conductive structure to form the molten material.

As shown in FIGS. 12 and 13, in another aspect, the step of causing the transition comprises causing an optical energy source to apply a high thermal energy to the outer conductor structure, thereby heating the outer conductive structure to form the molten material. As shown in FIGS. 14-17, in yet another aspect, the outer conductive structure is formed with at least one reduced cross-sectional area region, and the step of causing the transition comprises causing an electric current to flow through the reduced cross-sectional area region, thereby heating the reduced cross-sectional area region, via current crowding, to form the molten material.

As compared to Metal-Insulator-Metal (MIM) anti-fuse structures disclosed in the prior art, one or more embodiments of the invention provide a unique integration scheme as well as a novel metal-cavity-metal structure type anti-fuse structure. An outer conductor can be "opened," using, for example, electrical or optical means, while simultaneously allowing the melted conductive material from the outer conductor to flow inward and short the originally open inner conductor.

The outer conductive material can advantageously be the only material source for shorting the originally open inner conductor, using optical techniques such as a particle beam or laser ablation. Therefore, it is desirable that the outer conductor be formed from a lower melting point substance while the inner one uses a higher melting point substance.

In one or more embodiments, an exemplary anti-fuse structure comprises an outer conductive element, an inter-level insulating material and two inner conductive elements separated by a gap. More specifically, the inner conductive element lies at the base of a trench and is capped by insulating material, while the outer conductive element crosses over the inner conductive element and overhangs the sidewalls by a pair of spacer cavities. It is therefore desirable that the outer conductor be formed from a lower melting point metallic material, such as aluminum, or aluminum alloy, while the inner conductor is a higher melting point metallic material such as poly-silicon, tungsten, and the like.

One potential advantage of one or more embodiments of the invention over the prior art that an anti-fuse process can be programmed by using a lower energy level; unlike any of the prior arts, no breakthrough of inter-level dielectric film is necessary. Programming one or more embodiments of the inventive anti-fuse only requires energy to melt the outer conductor and allow the melted material to flow along the sidewalls of the trench or cavities to short to the inner conductors.

Yet further, one or more inventive embodiments enable placement of two fuse elements, e.g. the fuse and anti-fuse, together in a small space. This means that a single programming operation can simultaneously activate both fuse and anti-fuse.

Thus, one or more embodiments provide a unique merged fuse/anti-fuse apparatus comprising an outer conductor, cavity regions and a inner conductor. The outer conductor is formed by a material having a lower melting point than that of the inner conductor. The inventive structure may be operated as "fuse-only," "anti-fuse-only" or in a combination of "fuse-and-anti-fuse" for circuit programming applications. Programming is achieved via, e.g., electrical or optical techniques using relatively lower energy than that of the conventional MIM type anti-fuses.

It will be appreciated that in one or more embodiments of the invention, programming may include selectively blowing fuses and at the same time causing selected anti-fuses to become conductive.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A method of programming a fuse/anti-fuse structure adapted to transition between a first state and a second state, comprising the steps of:

providing a fuse/anti-fuse structure comprising:

an inner conductor structure, said inner conductor structure, in said first state, being electrically open and defining a gap, said inner conductor structure being adapted to become electrically conductive in said second state;

an insulating layer adjacent to said inner conductor structure;

an outer conductor structure adjacent to said insulating layer, said outer conductor structure, in said first state, being electrically conductive, said outer conductor structure being adapted to become electrically open in said second state; and a cavity-defining structure that defines at least one cavity, at least a portion of said cavity-defining structure being formed from said inner conductor structure, said insulating layer, and said outer conductor structure, said at least one cavity being located substantially adjacent said gap defined in said inner conductor structure; and causing said fuse/anti-fuse structure to transition between said first state where said inner conductor structure is open and said outer conductor structure is conductive and said second state wherein said inner conductor structure is conductive and said outer conductor structure is open, by transiently forming molten material from said outer conductor structure and causing said molten material to flow and close said inner conductor structure;

wherein:

in said first state, said outer conductor structure comprises a continuous wire having a relatively low resistance, less than approximately 100 ohms, and said inner conductor structure comprises first and second wire portions with said gap therebetween;

said outer conductive structure is formed with a main portion and a T projection; and said step of causing said transition comprises causing an electric current to flow from said main portion to said T projection, thereby heating said outer conductive structure to form said molten material.

\* \* \* \* \*